United States Patent
Huang et al.

(10) Patent No.: US 7,098,077 B2
(45) Date of Patent: Aug. 29, 2006

(54) SEMICONDUCTOR CHIP SINGULATION METHOD

(75) Inventors: Tai-Chun Huang, Hsin-Chu (TW); Kuan-Shou Chi, Hsinchu (TW); Chih-Hsiang Yao, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 10/761,004

(22) Filed: Jan. 20, 2004

(65) Prior Publication Data

US 2005/0158967 A1    Jul. 21, 2005

(51) Int. Cl.
*H01L 21/44* (2006.01)
*H01L 21/48* (2006.01)

(52) U.S. Cl. .................. 438/110; 438/113; 438/114; 438/907

(58) Field of Classification Search ........... 438/113, 438/114, 110, 907
See application file for complete search history.

(56) References Cited

U.S. PATENT DOCUMENTS

| | | | |
|---|---|---|---|
| 5,075,253 A * | 12/1991 | Sliwa, Jr. ................... 438/109 |
| 6,420,776 B1 | 7/2002 | Glenn et al. ............... 257/620 |
| 6,528,864 B1 * | 3/2003 | Arai ........................... 257/620 |
| 6,579,745 B1 * | 6/2003 | Sanaka et al. ............. 438/108 |
| 6,586,707 B1 | 7/2003 | Boyle et al. .......... 219/121.69 |
| 6,705,925 B1 * | 3/2004 | Cole et al. ................... 451/36 |
| 6,713,843 B1 * | 3/2004 | Fu ............................. 257/620 |
| 6,737,606 B1 * | 5/2004 | Peng et al. ........... 219/121.68 |
| 2002/0033558 A1 * | 3/2002 | Fahey et al. ............... 264/400 |
| 2004/0130002 A1 * | 7/2004 | Weeks et al. .............. 257/622 |
| 2004/0259291 A1 * | 12/2004 | Takiar ....................... 438/113 |

* cited by examiner

*Primary Examiner*—Trung Dang
(74) *Attorney, Agent, or Firm*—Haynes and Boone, LLP (57) ABSTRACT

A method to singulate a circuit die from an integrated circuit wafer is achieved. The method comprises providing an integrated circuit wafer containing a circuit die. The integrated circuit wafer is cut through by performing a single, continuous cut around the perimeter of the circuit die to thereby singulate the circuit die.

19 Claims, 6 Drawing Sheets

SEMICONDUCTOR CHIP SINGULATION METHOD

BACKGROUND OF THE INVENTION (1) Field of the Invention

The invention relates to a method of manufacturing an integrated circuit device, and, more particularly, to a novel method of singulating integrated circuit die from a semiconductor wafer.

(2) Description of the Prior Art

Integrated circuits are typically fabricated on large, thin wafers of semiconductor material, such as silicon. Tens, hundreds, or even thousands of independent and identical integrated circuits may be formed on a single wafer. It is this mass production of identical devices on a single wafer that gives integrated circuit manufacturing its economic advantage. This economic advantage of mass production of product on each wafer covers the large costs associated with the manufacturing facility, or fab, and the high technology equipment required to process and to test the products.

Figure 1:
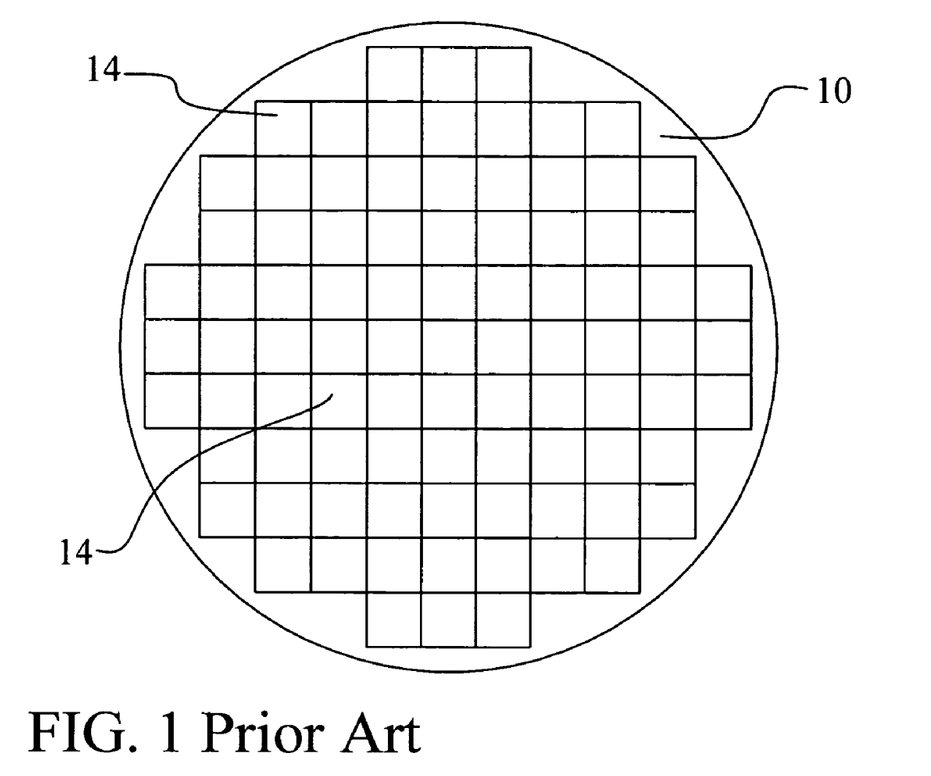
FIG. 1 illustrates a prior art integrated circuit wafer.

Referring now to FIG. 1, a prior art integrated circuit wafer 10 is shown. Integrated circuit wafers typically range in size from about 4 inches to about 16 inches or larger. In a typical configuration, a large number of circuit locations 14, also called die locations 14, are arranged across the wafer 10 in columns and rows. In the exemplary wafer, the die 14 are of a single size though each location may actually comprise different designs or products. Sometimes larger or smaller circuits 14 will be formed by combining several die locations or by dividing a single die location. However, as will be shown in the following, these multiple sized die cannot be independently singulated and removed from the integrated circuit wafer 10 without sacrificing other die locations.

In the typical manufacturing sequence, the integrated circuit wafer 10 is processed to completion of all levels. Next, the wafer 10 is tested using an automated tester. During this wafer-level test, each die location is probed and is tested for functionality and for parametric performance. The automated tester will then store the test results and may use a marking system to label the die locations 14 on the wafer 10 as either PASS or FAIL. For example, the automated tester can place an ink dot on every die location that has FAILED the test while leaving die locations that have PASSED the test as unmarked. At this point, the wafer 10 is prepared for the process of singulation.

Figure 2:
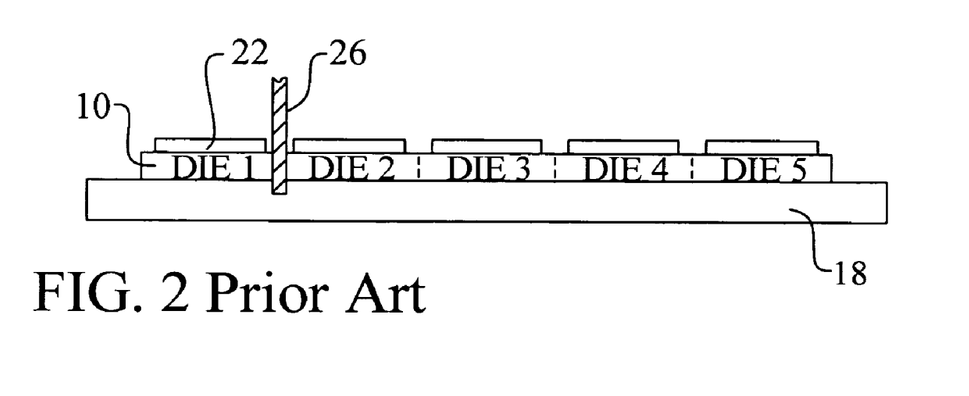
FIGS. 2 and 3 illustrate a prior art method of singulating circuit die from an integrated circuit wafer using a diamond bladed saw.

Referring now to FIG. 2, a prior art example of singulation is shown. The integrated circuit wafer 10, shown here in cross section, is attached to a frame 18 comprising an adhesive tape. This tape frame 18 holds the wafer 10 in place during the singulation process. Next, a diamond bladed saw 26 is used to cut through the wafer in a first direction. Note that the substrate of the wafer 10 is typically a continuous crystalline piece of silicon. Each die location 14, as shown by DIE1-DIE5, is actually a part of this same semiconductor substrate 10. Surface films 22, such as dielectric layers and conductive layers, are formed overlying the surface of the substrate 10 and are may or may not be contiguous across different die. The spaces between the surface films 22 are typically called "streets" and are the target locations for the diamond bladed saw 26. The saw 26 cuts completely through the substrate 10 to separate, for example, all of the die in the row containing DIE1 from all of the die in the row containing DIE2, and so on.

Figure 3:
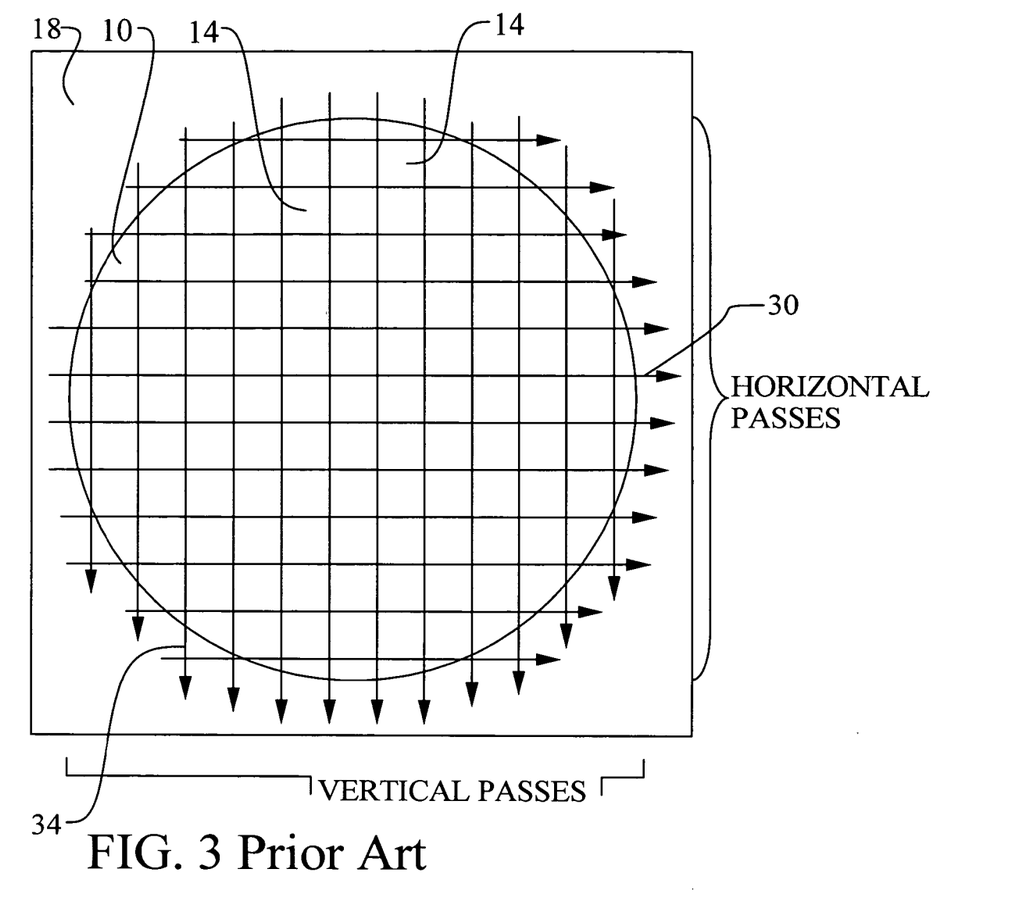

Referring now to FIG. 3, the singulation process of the prior art is shown in further detail in a top view. The wafer 10 is mounted on the adhesive tape frame 18. The diamond bladed saw, not shown, cuts across the wafer in a series of horizontal passes 30 and vertical passes 34. With each horizontal pass 30 from one side of the wafer 10 to the other side of the wafer 10, two rows of die locations are separated. With each vertical pass 34 from one side of the wafer 10 to the other side of the wafer 10, two columns of die locations are separated. Finally, after the completion of all of the horizontal passes 30 and vertical passes 34, all of the circuit die 14 are separated, or singulated, from the wafer 10.

Figure 4:
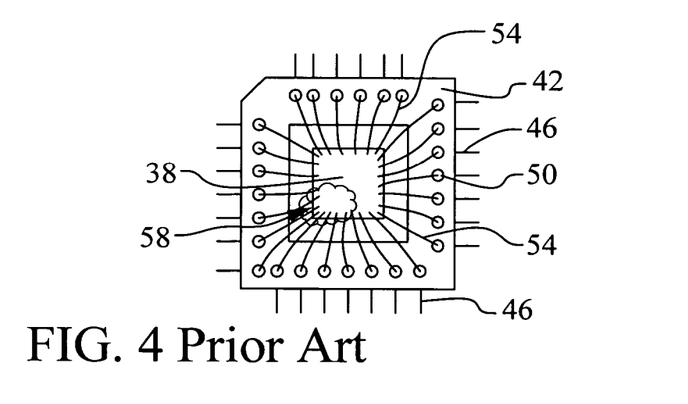
FIG. 4 illustrates a prior art, packaged integrated circuit device.

Next, further processes may be used to select and to remove the good die (those labeled as PASSED) from the wafer while leaving behind the bad die (those labeled as FAILED). In one process, good die are removed from the adhesive tape frame and placed onto packages. Referring now to FIG. 4, a prior art packaged integrated circuit is illustrated. The package 42 comprises a chip carrier means, such as a metal or ceramic surface, onto which the circuit die 38 is fixably mounted. The package 42 further comprises signal pins 46 which can physically interface critical signals into and out from (I/O) the integrated circuit 38. These package pins 46 are physically connected to the signals on the integrated circuit die 38 using, for example, very fine gold wire 54. This gold wire 54 is ultrasonically welded from pads on the integrated circuit die 38 to pads 50 on the package 42.

The above described package device can suffer from mechanical overstress. It is difficult to perfectly match the thermal conductivity of the integrated circuit die 38 and of the various components of the package 42. Therefore, thermal cycling can induce significant thermal stress into the die 38 or into the die 38 and package interface 42. This thermal stress is highest at boundaries and at corners. Therefore, the corners 58 of the die 38 are the highest mechanical stress points and are prone to mechanical failure (cracking or shearing). In addition, the concentration of wire bonds and related bond stress is highest in the corners of the die 38 and results in mechanical failure at these locations.

As described above, the present die singulation method creates rectangular die with sharp, 90° corners. However, it would appear to be advantageous to go away from rectangular-shaped, sharply cornered die in packaged integrated circuit applications.

Several prior art inventions relate to methods or apparatus for cutting semiconductor substrates. U.S. Pat. No. 6,586,707 B2 to Boyle et al describes a method and an apparatus for micromachining a semiconductor substrate. Ultraviolet and visible light lasers are used to machine various features into semiconductor substrates. U.S. Pat. No. 6,420,776 B1 to Glenn et al teaches a method and a structure where a laser scribe machine is used to singulate die on a semiconductor substrate. However, this method shows cutting across the wafer in rows and columns (FIGS. 3A and 6).

SUMMARY OF THE INVENTION

A principal object of the present invention is to provide an effective and very manufacturable method to form an integrated circuit device.

A further object of the present invention is to provide a method to singulate circuit die on integrated circuit wafer.

A yet further object of the present invention is to provide a method to singulate circuit die with novel and improved perimeter shapes.

A yet further object of the present invention is to provide a method to singulate multiple sizes and shapes and arrangements of circuit die on a single wafer.

A yet further object of the present invention is to provide a method to improve the performance of a packaged integrated circuit die.

A yet further object of the present invention is to provide integrated circuit die having improved performance due to novel perimeter shapes.

In accordance with the objects of this invention, a method to singulate a circuit die from an integrated circuit wafer is achieved. The method comprises providing an integrated circuit wafer containing a circuit die. The integrated circuit wafer is cut through by performing a single, continuous cut around the perimeter of the circuit die to thereby singulate the circuit die.

Also in accordance with the objects of this invention, an integrated circuit device is achieved. The device comprises a semiconductor substrate containing an electronic circuit. The semiconductor substrate has a non-rectangular perimeter. A package is included comprising a surface to fixably mount the semiconductor substrate. The package has a plurality of signal pins. A means is included for coupling the signal pins to signals in the electronic circuit.

Also in accordance with the objects of this invention, a method to singulate a circuit die from an integrated circuit wafer is achieved. The method comprises providing an integrated circuit wafer containing a circuit die. The integrated circuit wafer is cut through on a first part of the perimeter of the circuit die using a focused beam apparatus. The integrated circuit wafer is cut through on a second part of the perimeter of the circuit die using a wafer saw blade apparatus to thereby singulate the circuit die.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to manufacture an integrated circuit device. A novel method to singulate circuit die on an integrated circuit wafer is disclosed. Novel and useful circuit die shapes achieved using this method are described. It should be clear to those experienced in the art that the present invention can be applied and extended without deviating from the scope of the present invention.

Figure 5:
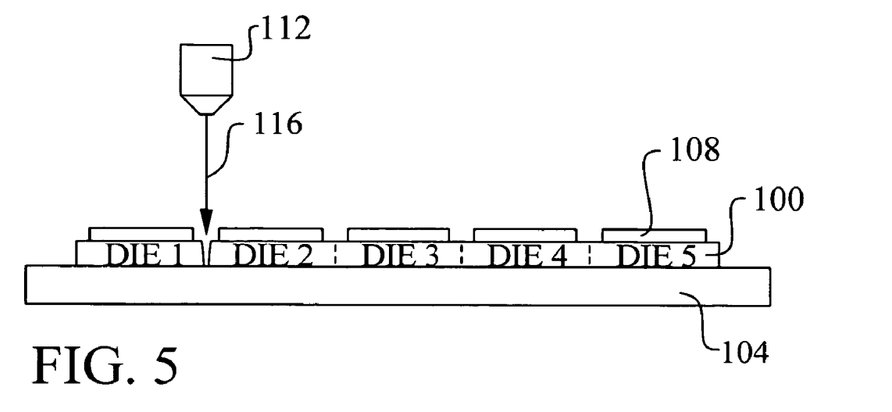
FIGS. 5 and 6 illustrate a first preferred embodiment of the present invention showing a novel method of singulating circuit die from an integrated circuit wafer using continuous cutting techniques and cutting beam apparatus.
Figure 6:
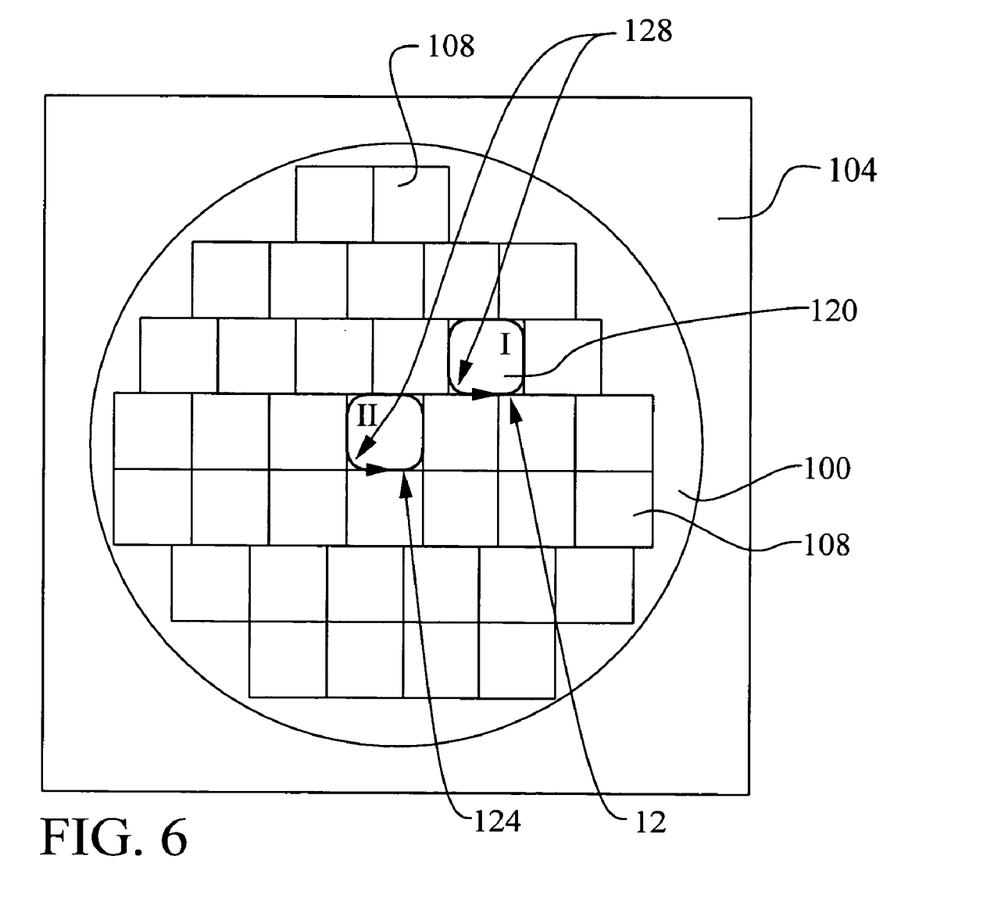

Referring now to FIGS. 5 and 6, a first preferred embodiment of the present invention showing a novel method of singulating circuit die from an integrated circuit wafer. Several important features of the present invention are shown and discussed below. Referring particularly to FIG. 5, an integrated circuit wafer 100 is shown in cross section. The wafer comprises a semiconductor substrate 100. The semiconductor substrate 100 preferably comprises silicon. A plurality of circuit die DIE1-DIE5 are formed in the wafer 100. The circuit die preferably comprise active and passive devices and interconnects formed in and on the substrate 100. In addition, conductive and dielectric film layers 108 are formed overlying the substrate 100. In the present invention, the sizes, shapes, and/or design of the circuit die can be different one from another. In addition, the circuit die do not have to be arranged in columns and in rows. Prior to singulation, in the preferred embodiment, the integrated circuit wafer 100 is mounted onto an adhesive tape frame 104.

As an important feature, the circuit die are singulated using a cutting beam 116. The cutting beam 116 comprises a focused beam and preferably comprises a laser light beam, a focused electron beam (e-beam) or a high-pressure water beam. The focused cutting beam 116 must have the ability to start a cut anywhere on the wafer surface and to end a cut anywhere on the wafer surface. By comparison, the diamond bladed saw of the prior art must, because of its physical construction, begin a cut from a first wafer edge, cut into the wafer, and then must continue cutting through to the opposite edge of the wafer. Therefore, the prior art singulation cuts are performed as a series of passes through the wafer as shown in FIG. 3. Referring again to FIG. 5, the cutting beam source 112 of the present invention is capable of focusing a beam 116 anywhere on the wafer surface and starting/stoping the cut instantly.

Referring now to FIG. 6, a top view of the tape mounted wafer 100 is shown in top view. A plurality of circuit die 108 are formed on the integrated circuit wafer 100. Note that the circuit die 108 are aligned in rows but are not aligned in columns. That is, the vertical outside edges of circuit die 108 are not aligned. It would not be practical to singulate the circuit die 108, in the vertical direction, using the prior art diamond bladed saw because the straight line cut would damage some of the die. However, by using a focused beam cutting apparatus 112, individual die may be singulated regardless of the die arrangement. More particularly, the die are singulated by cutting through the integrated circuit wafer in single, continuous cuts 124 around the perimeter of each circuit die 108. In the illustration, two circuit die I and II, are singulated by single, continuous cuts 124. The focus beam cutting method allows cutting to begin and to end within the integrated circuit wafer. By comparison, the prior art sawing technique can only make straight-line, cross cuts of the wafer.

By singulating individual die using a focus beam cutting method, optimal die perimeters, or shapes, can be generated. Referring again to FIG. 6, note that the cutting paths 124 for the singulated circuit die are non-rectangular. In the prior art, only rectangular die shapes could be practically created without sacrificing neighboring die location. In the present invention, however, it is practical to cut non-rectangular shapes and to do so without damaging neighboring die. In the example of FIG. 6, the circuit die I and II are cut such that the corners 128 are rounded. This corner rounding 128 is achieved without damaging neighboring die locations.

Figures 7, 8:
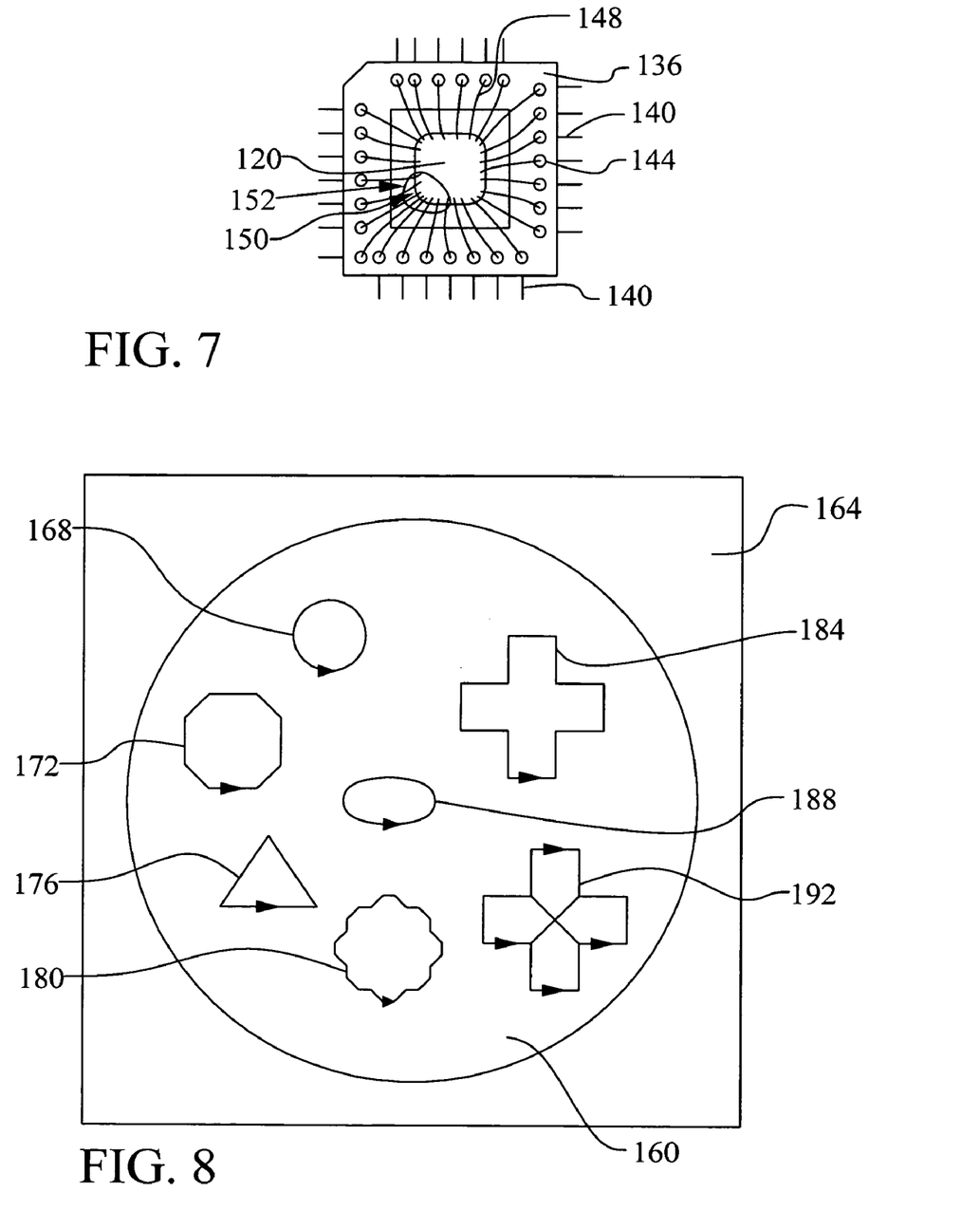
FIG. 7 illustrates a second preferred embodiment of the present invention showing a packaged integrated circuit featuring curved corners for reduced mechanical stress.
FIG. 8 illustrates a third preferred embodiment of the present invention showing various circuit die shapes cut from an integrated circuit wafer.

Referring now to FIG. 7, a second preferred embodiment of the present invention is illustrated. The "rounded" circuit die 132 created by continuous, perimeter cutting, can be advantageously used in packaged integrated circuit configurations. The individual circuit die 120 are removed from the tape frame 104 and then are mounted onto a chip carrier or package 136. The I/O pins 140 of the package are then bonded to the I/O pins of the circuit die 120 using, for example, fine gold wire 148. The gold wire 148 is ultrasonically welded from pads on the circuit die 120 to pads 144 on the package. The novel circuit die shape of the present invention comprises rounded corners 150 in this embodiment. The rounded corners 150 spread out the mechanical in the corner areas 152 caused by thermal mismatch and by bonding. As a result, the novel packaged integrated circuit exhibits better reliability.

Referring now to FIG. 8, a third preferred embodiment of the present invention is illustrated. On this mounted wafer 160, several novel circuit die shapes 168, 172, 176, 180, 184, 188, and 192 are shown. The concept of singulating each circuit die using a continuous cut around the perimeter is extended to show several exemplary shapes that can be cut using a focused beam cutting technique. For example, the circuit die shape could be circular 168 or elliptical 188. Circular or elliptical shaped die 168 and 188 could be useful for further reducing maximum stress locations on mounted die. Circuit die having more than four sides 172, 180, and 184 could be fabricated. Alternatively, triangular shapes 176 could be used. Alternative shapes can be usefully integrated into arrays as shown by the four circuit die configuration 192. In addition, non-rectangular shapes such as "L" shapes, "H" shapes, "T" shapes, or curved shapes may be used.

Figure 9:
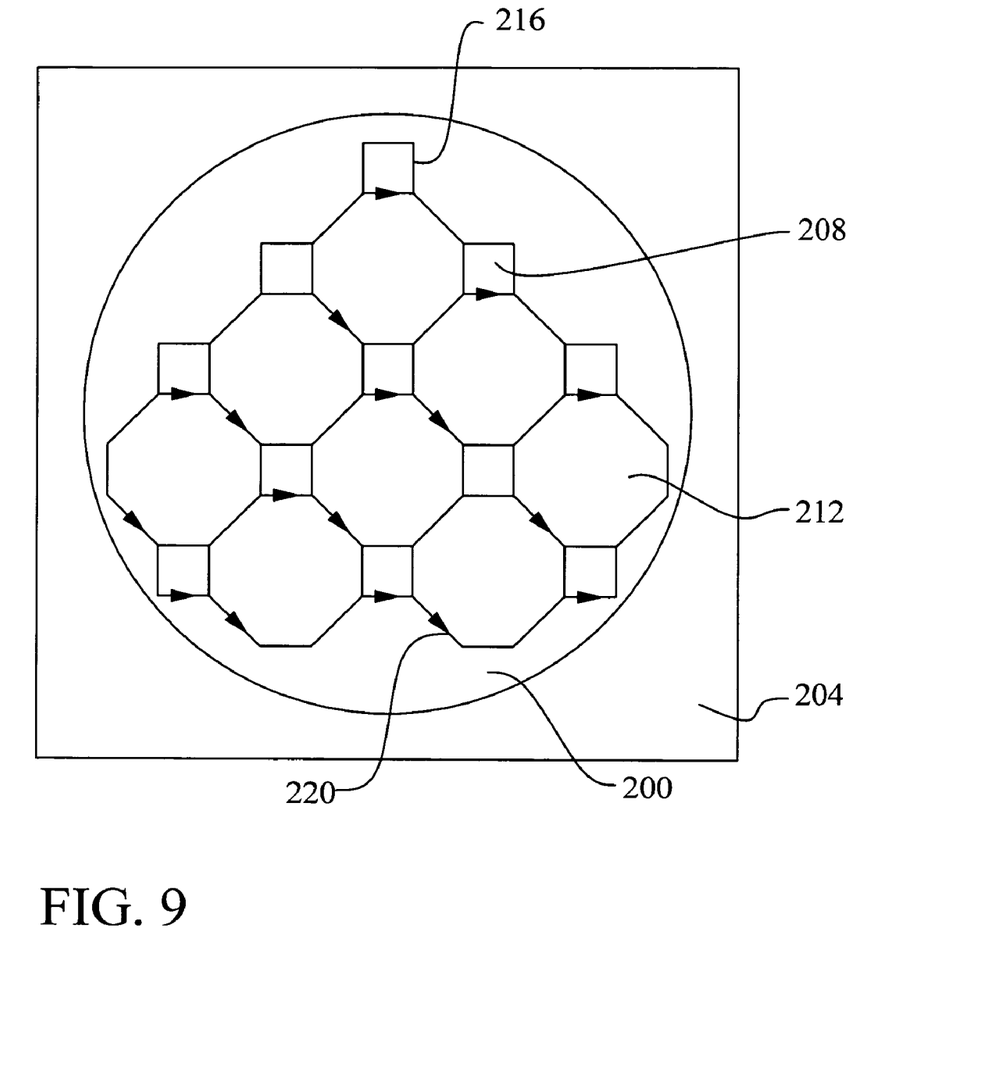
FIG. 9 illustrates an integrated circuit array comprising two shapes.

Referring now to FIG. 9, another exemplary circuit array is shown. In this case, the mounted wafer 200 comprises an array of circuit die comprising two different sizes 208 and 212. A large die 212 is formed having an eight-sided shape. A smaller die 208 is formed having four-sided shape. Further, the four-sided shape 208 and the eight-sided shape 212 are arranged in a pattern overlying the wafer 200. It would not be possible, without die damage, to singulate this wafer 200 into large die 212 and small die 208 using the prior art method. However, by using the focused beam and by cutting through the wafer 200 using continuous cuts 216 and 220 around the die parameters, it is possible to successfully singulate the large die 212 and the small die 208 in the present invention. The cut paths 216 and 220 are shown by the arrows on the die perimeters.

Figure 10:
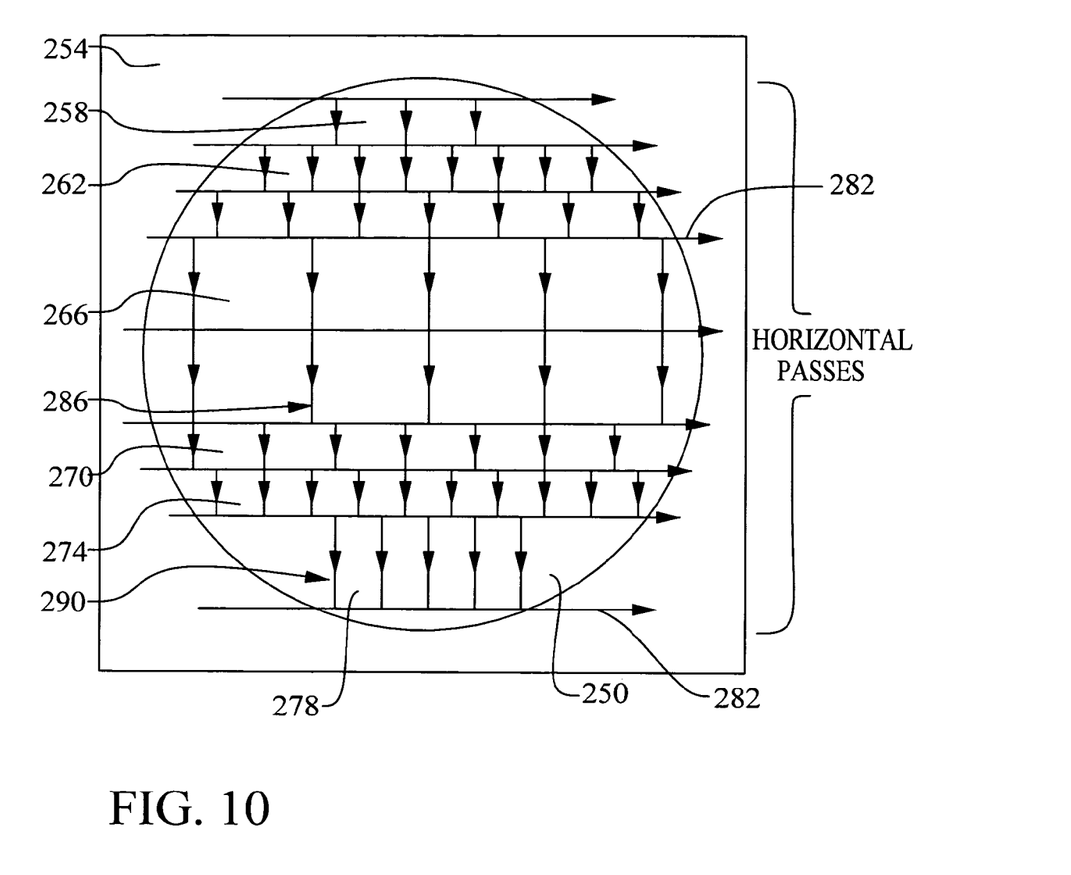
FIG. 10 illustrates a fourth preferred embodiment of the present invention wherein a hybrid singulation approach is shown.

Referring now to FIG. 10, a fourth preferred embodiment of the present invention is illustrated. In this case, a hybrid singulation method is used. In the hybrid method, the novel, focused beam cutting method is combined with the diamond bladed sawing method. As shown, a wafer 250 is attached to a tape frame 254. The wafer 250 comprises a plurality of circuit die. The circuit die comprise several sizes 258, 262, 266, 270, 274, and 278. The die are arranged into rows such that it is possible to use the diamond bladed saw to singulate the die in the horizontal direction. Therefore, a series of horizontal sawing passes 282 may be used to cut through the wafer 250 in the row direction. However, due to the differing die sizes on the wafer 250, it is not possible to use the diamond bladed saw to cut in the vertical direction. The vertical edges of the die simply do not line up. Therefore, the focused beam is used to cut through the wafer 250 in short segments 286 on the vertical edges of each circuit die. The vertical cuts 286, shown with arrows, complete the singulation of the circuit die without damaging neighboring die. The hybrid concept of could be reversed such that the sawing is performed in the vertical direction and the segmented cuts are performed in the horizontal direction.

The advantages of the present invention may now be summarized. An effective and very manufacturable method to form an integrated circuit device is achieved. A method to singulate circuit die with novel and improved perimeter shapes is achieved. Multiple sizes and shapes and arrangements of circuit die on a single wafer are made possible using the method. The reliability performance of a packaged integrated circuit die can be improved through the use of optimal die shapes.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to singulate a circuit die from an integrated circuit wafer, said method comprising:
   providing an integrated circuit wafer containing a circuit die;
   cutting through said integrated circuit wafer by performing a single, continuous cut around more than one side of the perimeter of said circuit die at a time to thereby singulate said circuit die.

2. The method according to claim 1 wherein said singulated circuit die comprises a non-rectangular perimeter.

3. The method according to claim 1 wherein said singulated circuit die comprises a perimeter having rounded corners.

4. The method according to claim 1 wherein said singulated circuit die comprises a perimeter having more than four sides.

5. The method according to claim 1 wherein said singulated circuit die comprises a perimeter having three sides.

6. The method according to claim 1 wherein said singulated circuit die comprises an elliptical perimeter.

7. The method according to claim 1 wherein said singulated circuit die comprises a circular perimeter.

8. The method according to claim 1 wherein said step of cutting through is performed using a laser.

9. The method according to claim 1 wherein said step of cutting through is performed using an electron beam or water jet.

10. The method according to claim 1 further comprising:
    fixably mounting said singulated circuit die onto a package; and
    coupling signal pins of said package to signals in said electronic circuit.

11. A method to singulate a circuit die from an integrated circuit wafer, said method comprising:
    providing an integrated circuit wafer by performing a single, continuous cut around more than one side of the perimeter of said circuit die at a time to thereby singulate said circuit die and wherein said singulated circuit die comprises a non-rectangular perimeter;
    fixably mounting said singulated circuit die to a package; and
    coupling signal pins of said package to signals in said electronic circuit.

12. The method according to claim 11 wherein said non-rectangular perimeter has rounded corners.

13. The method according to claim 11 wherein said non-rectangular perimeter more than four sides.

14. The method according to claim 11 wherein said non-rectangular perimeter has three sides.

15. The method according to claim 11 wherein said non-rectangular perimeter is an ellipse.

16. The method according to claim 11 wherein said non-rectangular perimeter is a circle.

17. The method according to claim 11 wherein said step of cutting trough is performed using a laser.

18. The method according to claim 11 wherein said step of cutting through is performed using an electron beam or a water jet.

19. A method to singulate a circuit die from an integrated circuit wafer, said method comprising:

providing an integrated circuit wafer containing a circuit die;

providing a first cut partially cutting said integrated circuit wafer using a focused beam apparatus;

providing a second cut cutting through said integrated circuit wafer using a wafer saw blade apparatus;

wherein at least one of the first and second cut is performed by a single continuous cut around more than one side of the perimeter of said circuit die at a time.

* * * * *